United States Patent
Shao et al.

(10) Patent No.: US 7,510,947 B2
(45) Date of Patent: Mar. 31, 2009

(54) METHOD FOR WAFER LEVEL PACKAGING AND FABRICATING CAP STRUCTURES

(75) Inventors: Shih-Feng Shao, Taipei Hsien (TW); Ming-Yen Chiu, Ping-Tung Hsien (TW)

(73) Assignee: Touch Micro-System Technology Inc., Yangmei Township, Taoyuan County (TW)

( * ) Notice: Subject to any disclaimer, the term of this patent is extended or adjusted under 35 U.S.C. 154(b) by 514 days.

(21) Appl. No.: 11/428,409

(22) Filed: Jul. 3, 2006

(65) Prior Publication Data
US 2007/0161210 A1 Jul. 12, 2007

(30) Foreign Application Priority Data
Jan. 12, 2006 (TW) ............... 95101276 A (51) Int. Cl.
*H01L 21/30* (2006.01)
*H01L 21/46* (2006.01)
(52) U.S. Cl. .............. 438/456; 257/E33.058; 257/E31.11
(58) Field of Classification Search .......... 438/456
See application file for complete search history.

(56) References Cited

U.S. PATENT DOCUMENTS

| 6,407,381 | B1 | 6/2002 | Glenn |
| 7,061,106 | B2 | 6/2006 | Yang et al. |
| 7,087,464 | B2 | 8/2006 | Yu et al. |
| 7,265,027 | B2 * | 9/2007 | Yang ..................... 438/456 |
| 7,291,513 | B2 * | 11/2007 | Ouellet et al. ............ 438/64 |
| 2004/0077121 | A1 | 4/2004 | Maeda | |

FOREIGN PATENT DOCUMENTS

| TW | 1222705 | 10/2004 |
| TW | 1240338 | 9/2005 |
| TW | 200532869 | 10/2005 |

* cited by examiner

*Primary Examiner*—David A Zarneke
(74) *Attorney, Agent, or Firm*—Winston Hsu (57) ABSTRACT

A cap wafer with patterned film formed thereon is etched through areas not covered by the patterned film to form a plurality of openings. Then, the cap wafer is bonded to a transparent wafer, and the cap wafer around the pattern film is segmented to form a plurality of cap structures. A device wafer with a plurality of devices and a plurality of contact pads electrically connected to the devices is subsequently provided. The cap structures and the device wafer are hermetically sealed to form a plurality of hermetic windows on the devices.

25 Claims, 13 Drawing Sheets

METHOD FOR WAFER LEVEL PACKAGING AND FABRICATING CAP STRUCTURES

BACKGROUND OF THE INVENTION

1. Field of the Invention

The present invention relates to a method for wafer level packaging, and more particularly, to a method for wafer level packaging having a hermetic window formed by hermetic bonding of cap structures to a device wafer.

2. Description of the Prior Art

Figure 1:
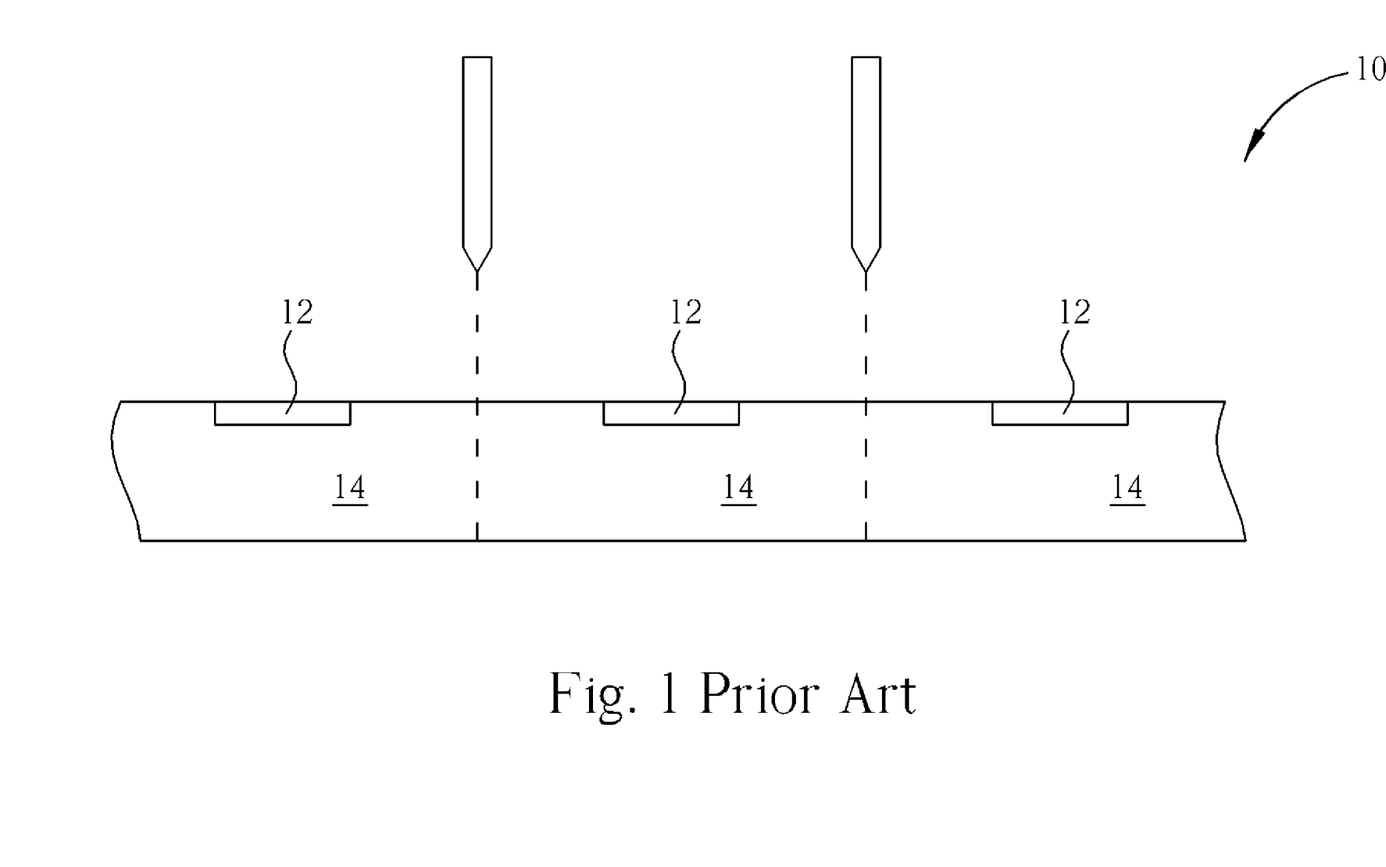
FIGS. 1-4 are schematic diagrams illustrating a conventional method for packaging.

Generally, a wafer level package (WLP) is a semiconductor package in which the size of a finished package is similar to or slightly larger than a semiconductor die. After completion of all test processes and assembly processes or packaging processes, individual semiconductor packages are separated from a wafer having a plurality of semiconductor dies. Therefore WLP not only decreases a size of a memory module, but also satisfies a demand for high density. Further, WLP improves transmission speed and stability by effectively reducing noise. Please refer to FIGS. 1-4, which are schematic diagrams illustrating a conventional method for packaging. As shown in FIG. 1, a device wafer 10 including a plurality of devices 12 positioned on its surface is provided. A dicing process is performed according to predefined scribe lines (not shown) so as to separate the device wafer 10 into a plurality of dies 14.

Figure 2:
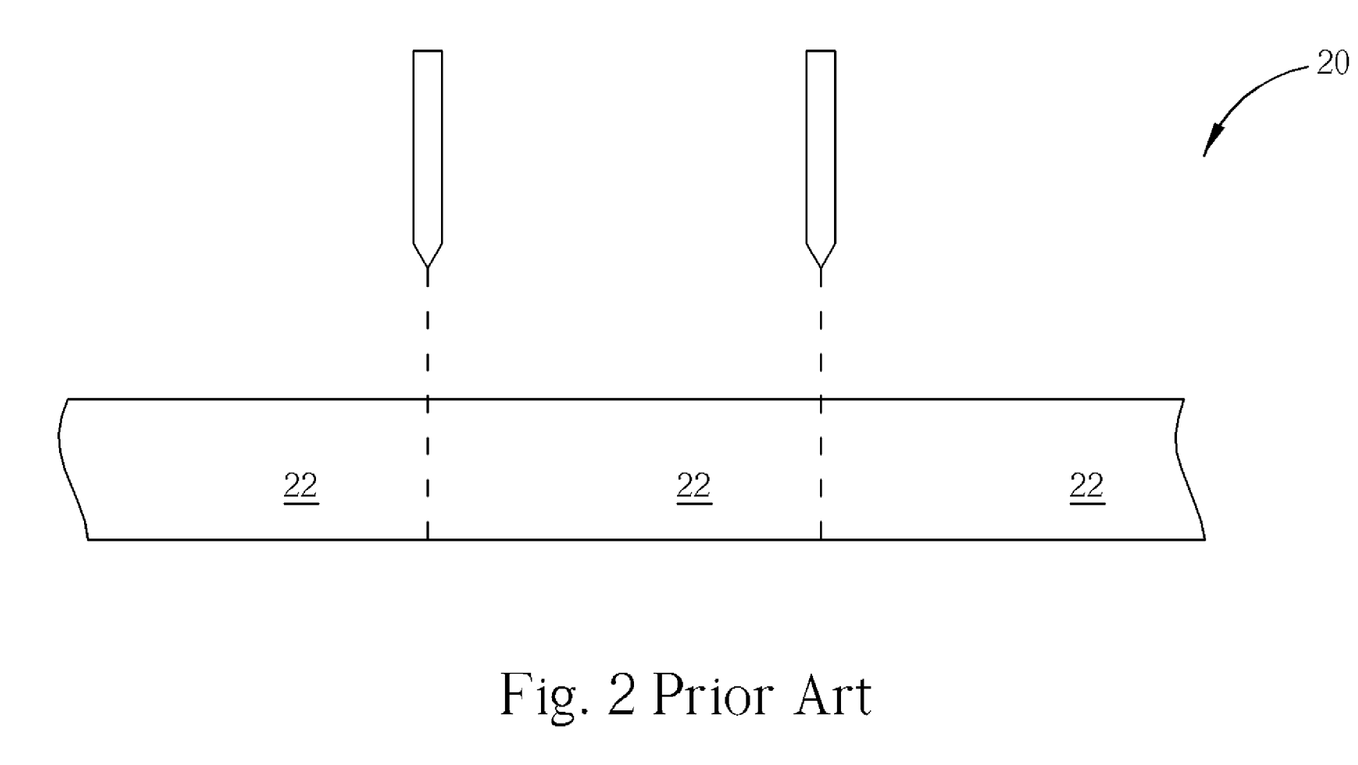
Figure 3:
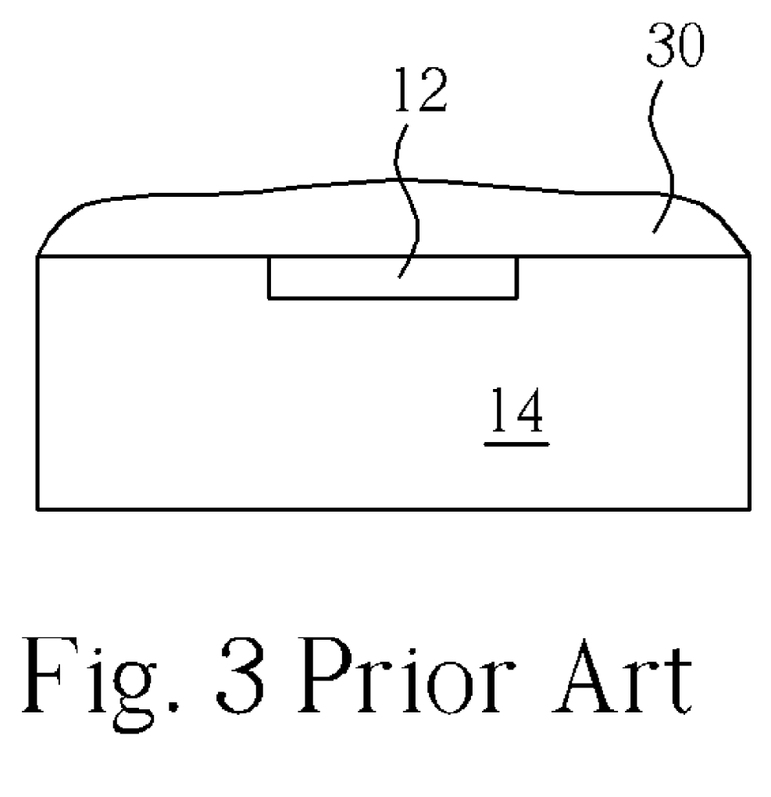
Figure 4:
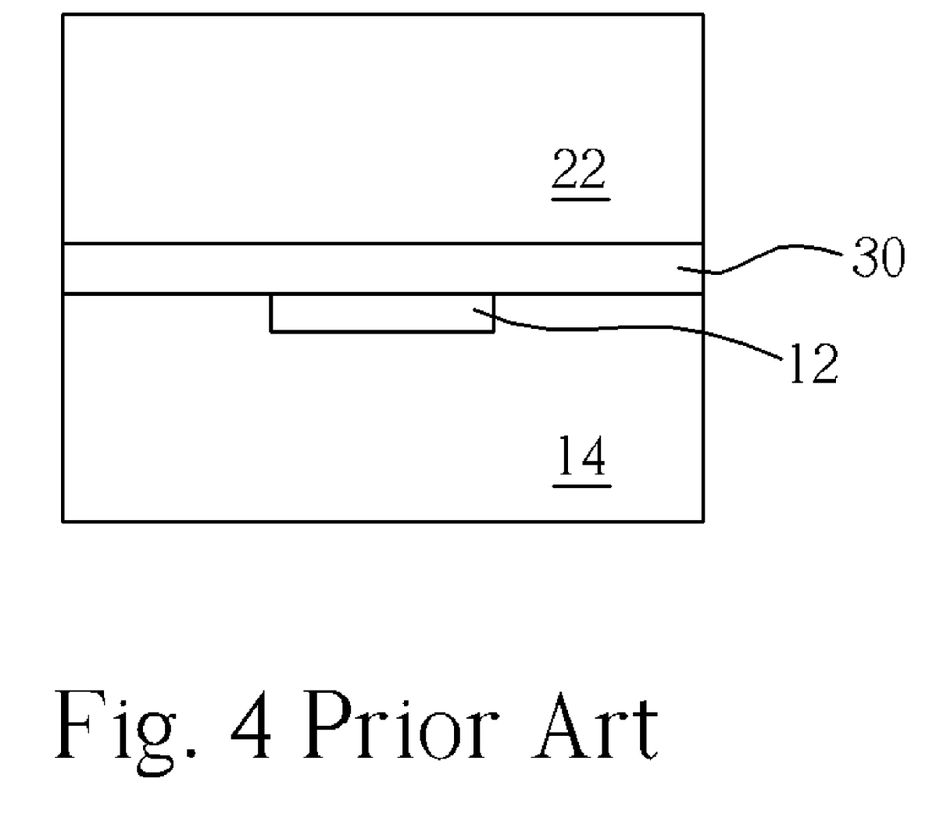

Please refer to FIG. 2. A cap wafer 20 is provided and undergoes a segmenting process to form a plurality of caps 22. The shape of each cap 22 corresponds to each die 14 while the size of each cap 22 is similar to or slightly smaller than the size of the die 14. Please refer to FIG. 3. A sealing agent 30, such as a polymer glue, is applied to a surface of the die 14. As shown in FIG. 4, the cap 22 is bonded to the die 14 by the sealing agent 30.

When the device wafer carries image sensory devices or microelectromechanical systems (MEMS) devices, which need space for light-sensing areas or allowing the MEMS devices to move, hermetic windows are required to protect the devices from contamination by air, dust, moisture, etc. The hermetic windows also protect the devices from mechanical or radioactive influences, prevent gas, which fills the hermetic window of the image sensory device die, from leaking, and prevent destruction of the vacuum condition of the hermetic window of the MEMS device die. The reliability and lifetime of the die depend on the hermetic window made by the hermetically sealed cavity or protective cap. In addition, the sealing agent used in the conventional method is easily affected by heat and thus affects the reliability of the package, making the sealing agent unsuitable for hermetic packaging.

In addition to the consideration of hermetic sealing mentioned above, the dies are individually and manually bonded to the protective caps and packaged after dicing of the device wafer. Therefore the conventional method reduces the efficiency of back-end-of-line processes and the yield of semiconductor packaging processes or MEMS processes, and suffers the disadvantages of high cost and labor.

SUMMARY OF THE INVENTION

It is therefore a primary object of the present invention to provide a method for wafer level packaging having a hermetic window.

According to the claimed invention, a method for wafer level packaging and fabricating cap structures is provided. The method comprises steps of providing a cap wafer, forming a patterned film on a surface of the cap wafer and forming a plurality of openings penetrating the cap wafer, bonding the cap wafer to a transparent wafer at the surface having the patterned film, the patterned film not being bonded to the transparent wafer, and segmenting the cap wafer around the patterned film and removing parts of the cap wafer covered by the patterned film to form a plurality of cap structures. The method also comprises steps of providing a device wafer with a plurality of devices and a plurality of contact pads electrically connected to the devices, and hermetically bonding the cap structures to the device wafer at positions corresponding to the devices to form a plurality of hermetic windows.

According to the method provided by the present invention, the wafer level package having a hermetic window has an advantage of batch production over manually bonding individual cap structures to individual dies.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
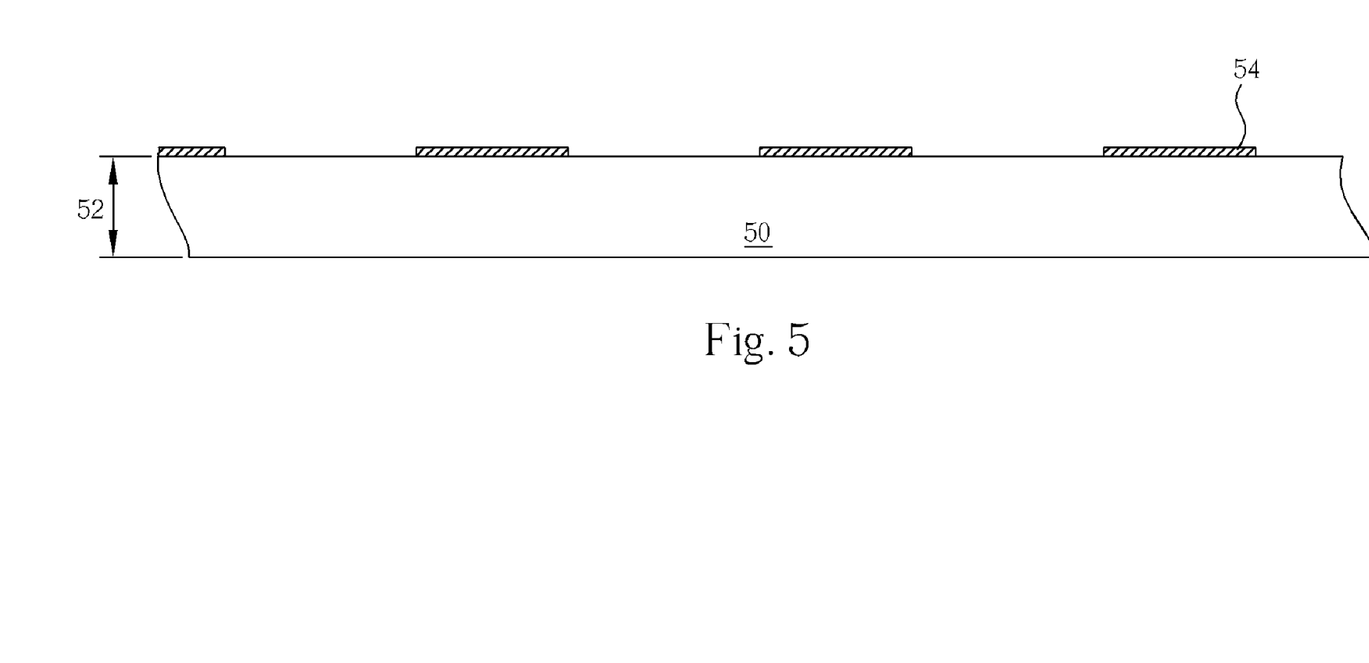
FIGS. 5-13 are schematic diagrams illustrating the method for wafer level packaging and fabricating cap structures provided by the present invention.

Please refer to FIGS. 5-13 which are schematic diagrams illustrating the method for wafer level packaging and fabricating cap structures provided by the present invention. As shown in FIG. 5, a cap wafer 50, such as a semiconductor wafer, having a thickness 52 is first provided. Then, a patterned film 54 is formed on a surface of the cap wafer 50. The patterned film 54 has a layout used to define sizes and shapes of a plurality of hermetic windows (not shown in FIG. 5). The patterned film 54 can be a metal film formed by a process such as sputtering, E-Gun, or atomic layer deposition (ALD). The patterned film 54 can also be a nonmetal film, such as a silicon nitride film or silicon oxide film, formed by a process such as plasma-enhanced chemical vapor deposition (PECVD).

Figure 6:
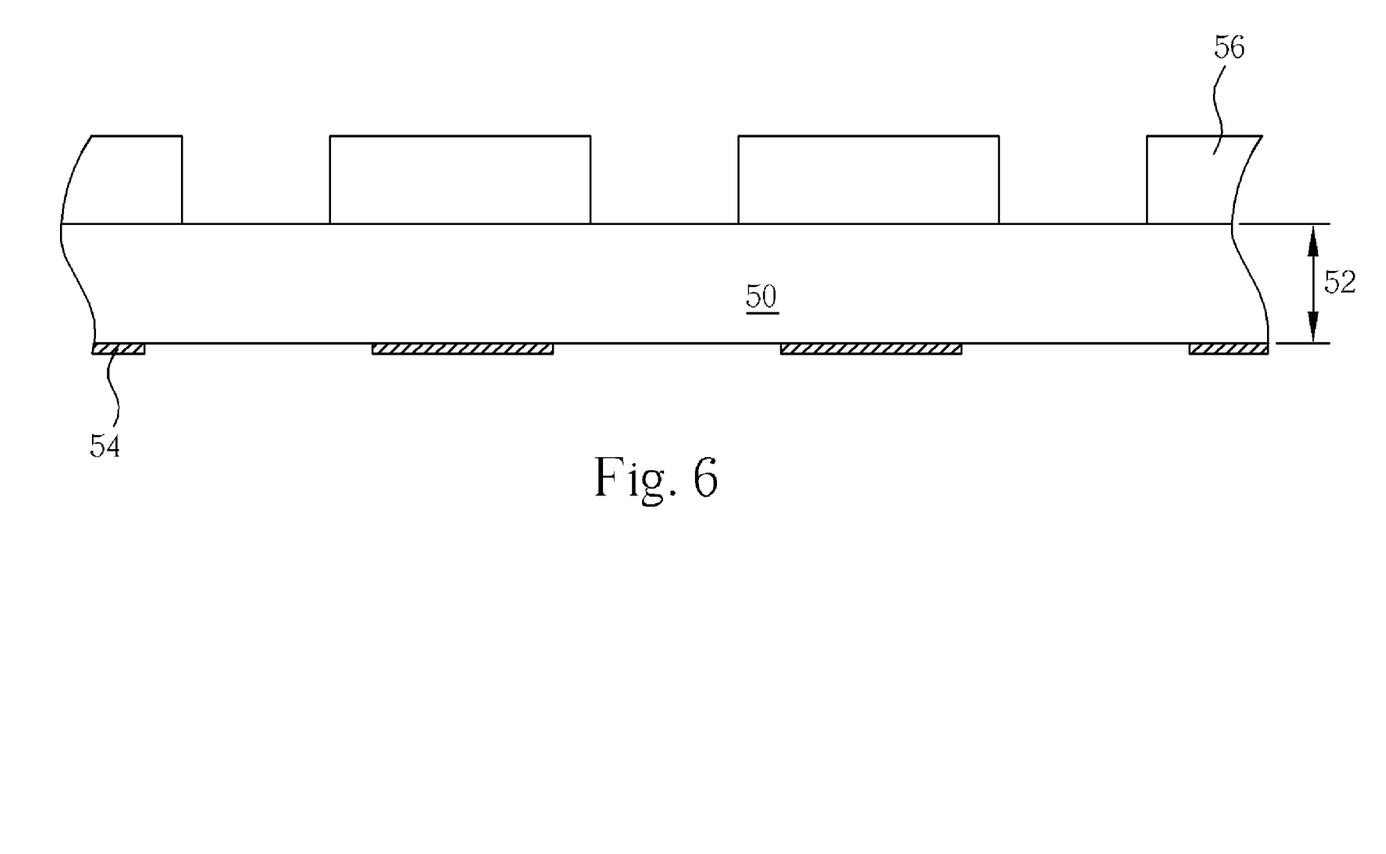
Figure 7:
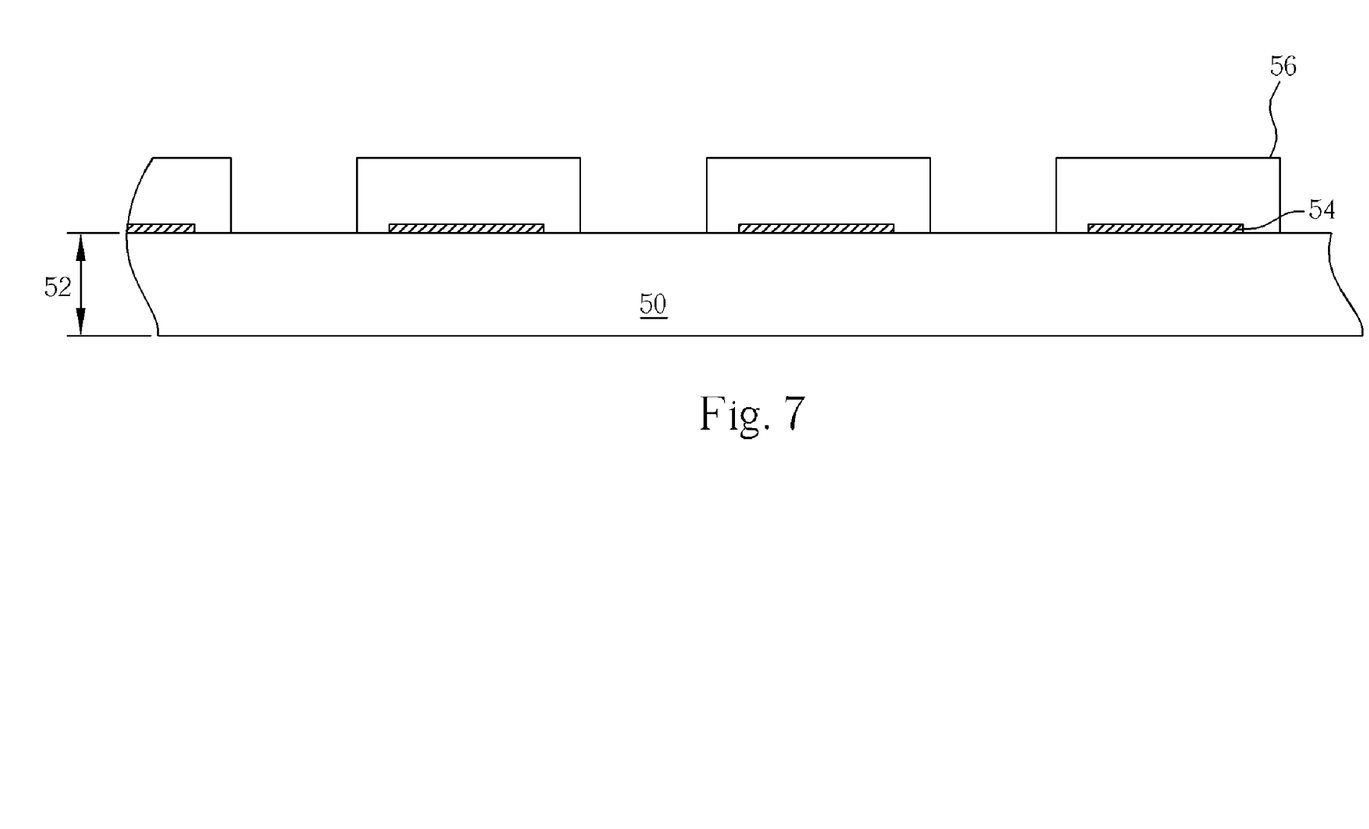
Figure 8:
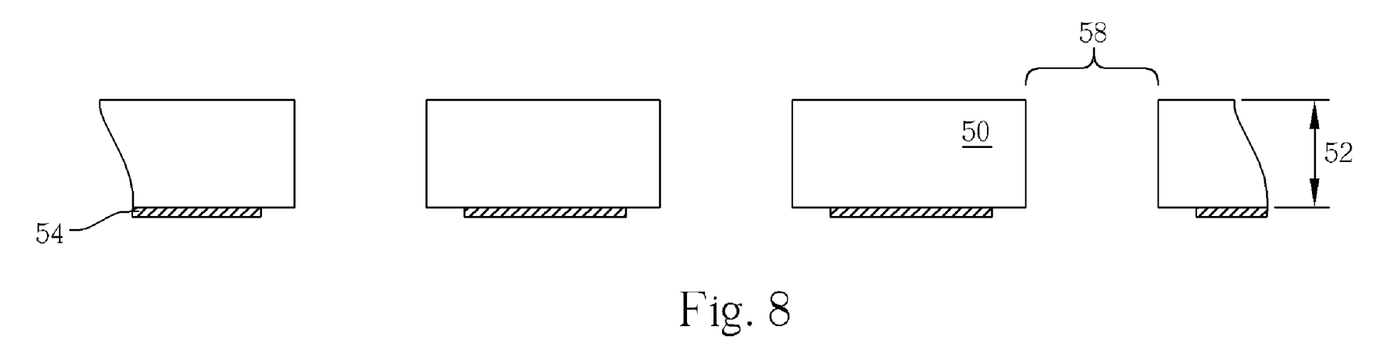

Please refer to FIG. 6. A patterned photoresist 56 is formed on a surface opposite to the patterned film 54. It is noteworthy that the areas covered by the patterned photoresist 56 are larger than the areas covered by the patterned film 54. In addition, the patterned film 54 and the patterned photoresist 56 can be formed on the same surface of the cap wafer 50 as shown in FIG. 7. Next, as shown in FIG. 8, an etching process is performed, with the patterned photoresist 56 being a mask, to form a plurality of openings 58 penetrating the cap wafer 50. After the etching process, the patterned photoresist 56 is removed.

Figure 9:
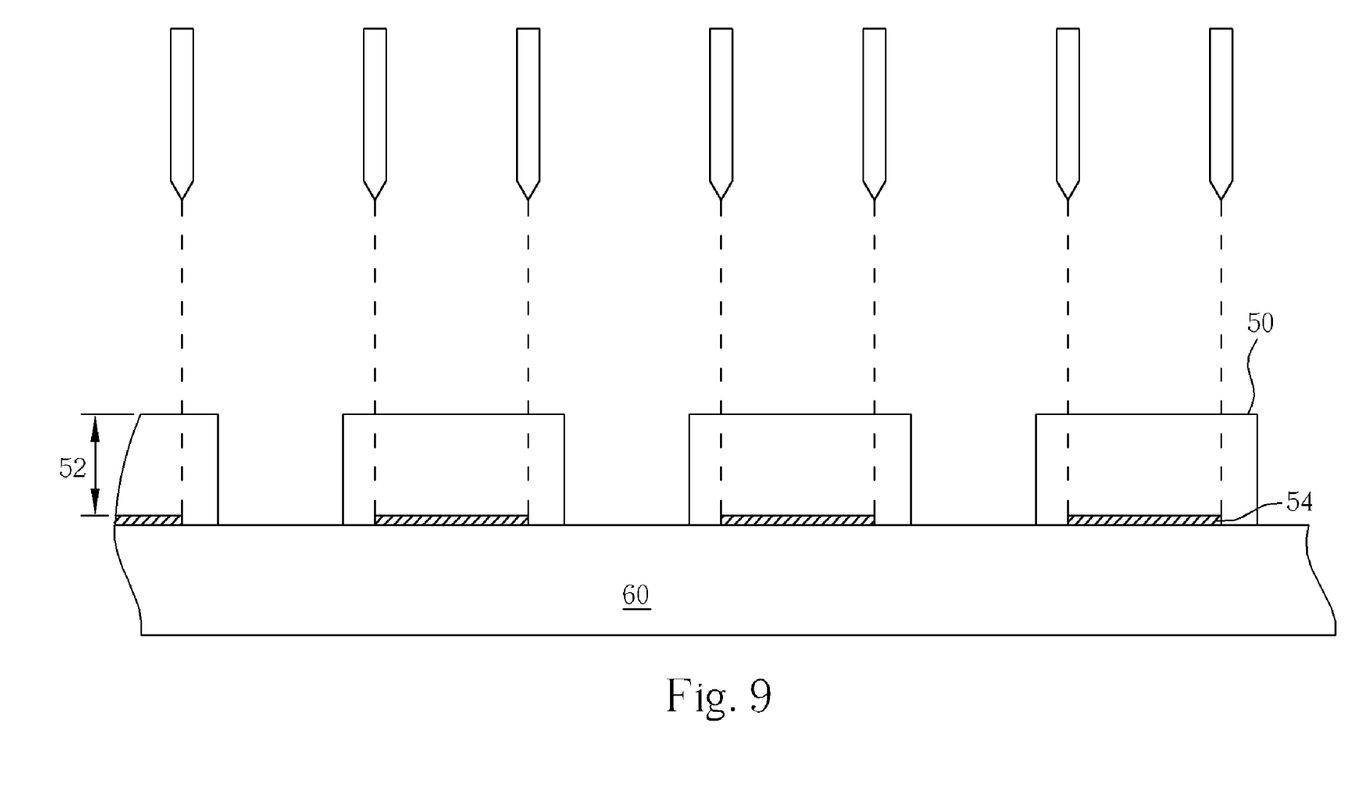

Please refer to FIG. 9. A transparent wafer 60, such as a glass wafer or a quartz wafer, is provided. The cap wafer 50 is bonded to the transparent wafer 60 at the surface having the patterned film 54 by an anodic bonding process which applies a high voltage to the cap wafer 50 and the transparent wafer 60, which are connected to a positive electrode and a negative electrode respectively, and bonds the cap wafer 50 and the transparent wafer 60 at a temperature ranging from 400-500° C. The cap wafer 50 can also be bonded to the transparent wafer 60 by a fusion bonding process, which bonds the cap wafer 50 and the transparent wafer 60 at a temperature ranging from 650-800° C. It is noteworthy that due to the high temperature requirements for the anodic bonding process and the fusion bonding process, the patterned film 54 necessarily comprises a thermally insulated material such as titanium. Furthermore, because the anodic bonding process and the fusion bonding process require no adhesive medium, the cap structure formed in a later step has an advantage of better air tightness.

Figure 10:
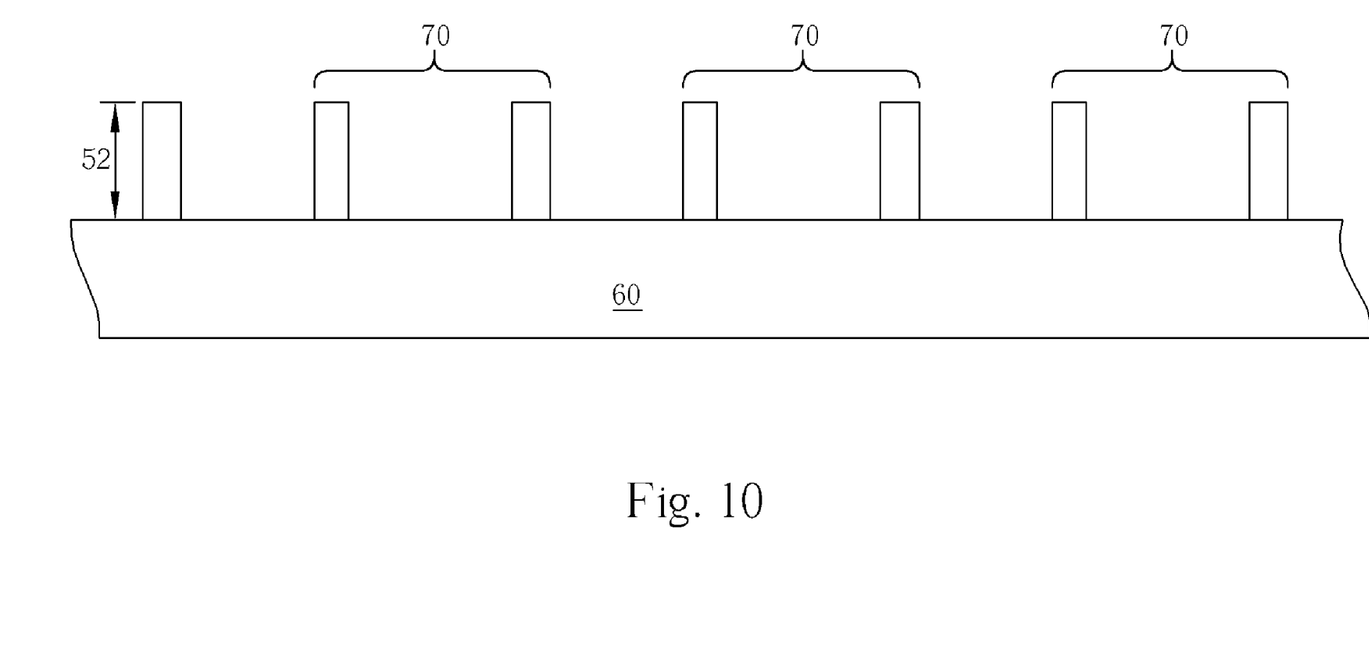

Please refer to FIGS. 9-10. Because parts of the cap wafer 50 are covered by the patterned film 54, those parts cannot be bonded to the transparent wafer 60 in the bonding process. Then, a first segmenting process is performed to segment the cap wafer 50 around the patterned film 54. During the first segmenting process, the depth of the segmenting equals the thickness 52 of the cap wafer 50. In addition, as mentioned above, because the parts covered by the patterned film 54 cannot be bonded to the transparent wafer 60, those parts can be removed to form a plurality of cap structures 70 after the first segmenting process. It is noteworthy that before the first segmenting process, a thinning process can be performed to adjust the thickness 52 of the cap wafer 50 to obtain a proper range between the cap structures 70 and a device wafer (not shown in FIGS. 9-10).

Figure 11:
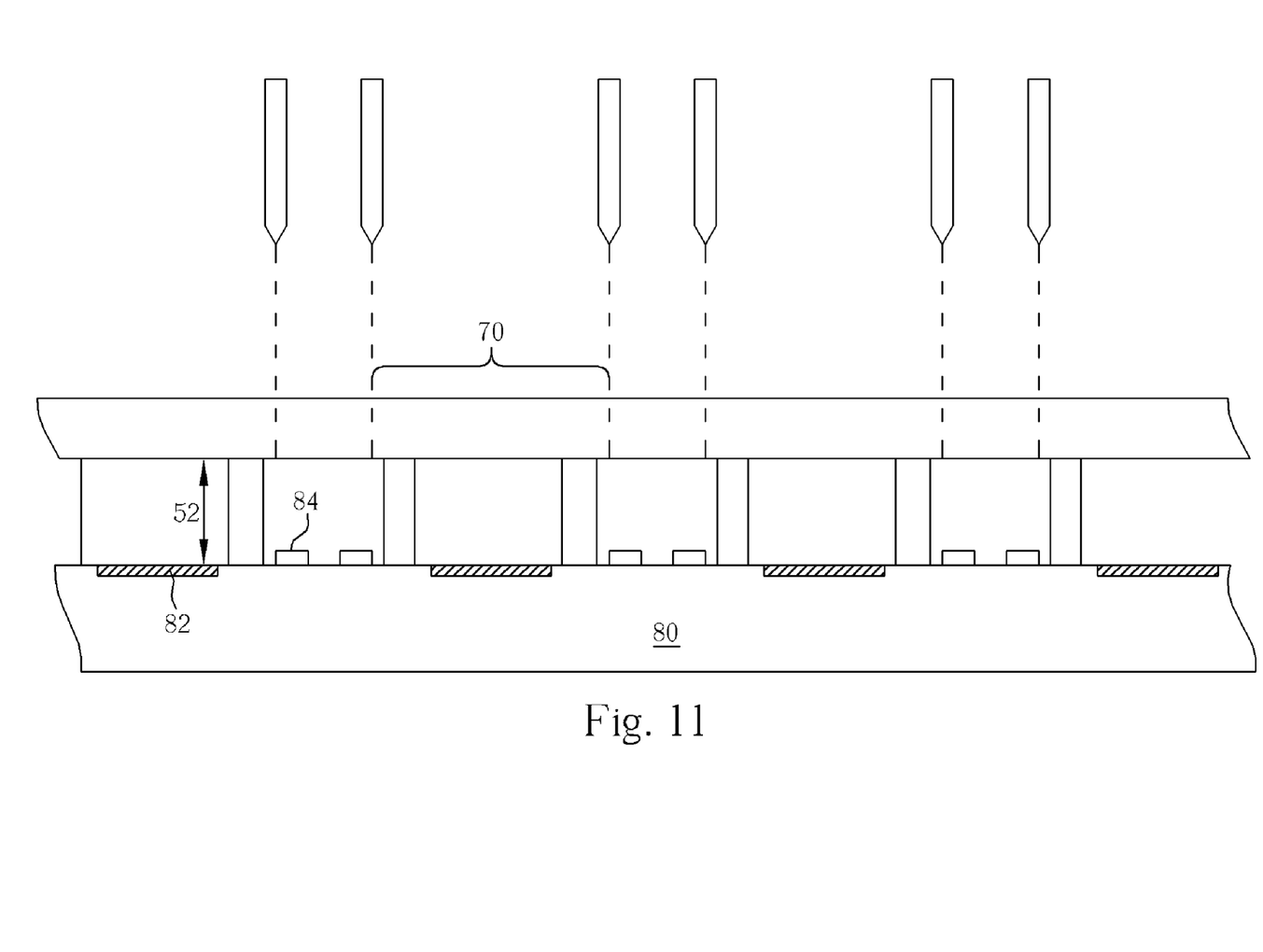

Please refer to FIG. 11. Hereinafter, a device wafer 80 is provided. The device wafer 80 comprises a plurality of devices 82 such as semiconductor devices, optical devices, or electromechanical devices. The device wafer 80 also comprises a plurality of contact pads 84 electrically connected to the device 82. Then, an alignment process is performed to make the cap structures 70 correspond to the device 82. A eutectic bonding process, or a glass frit bonding process, is performed to hermetically bond the cap structures 70 to the device wafer 80.

Figure 12:
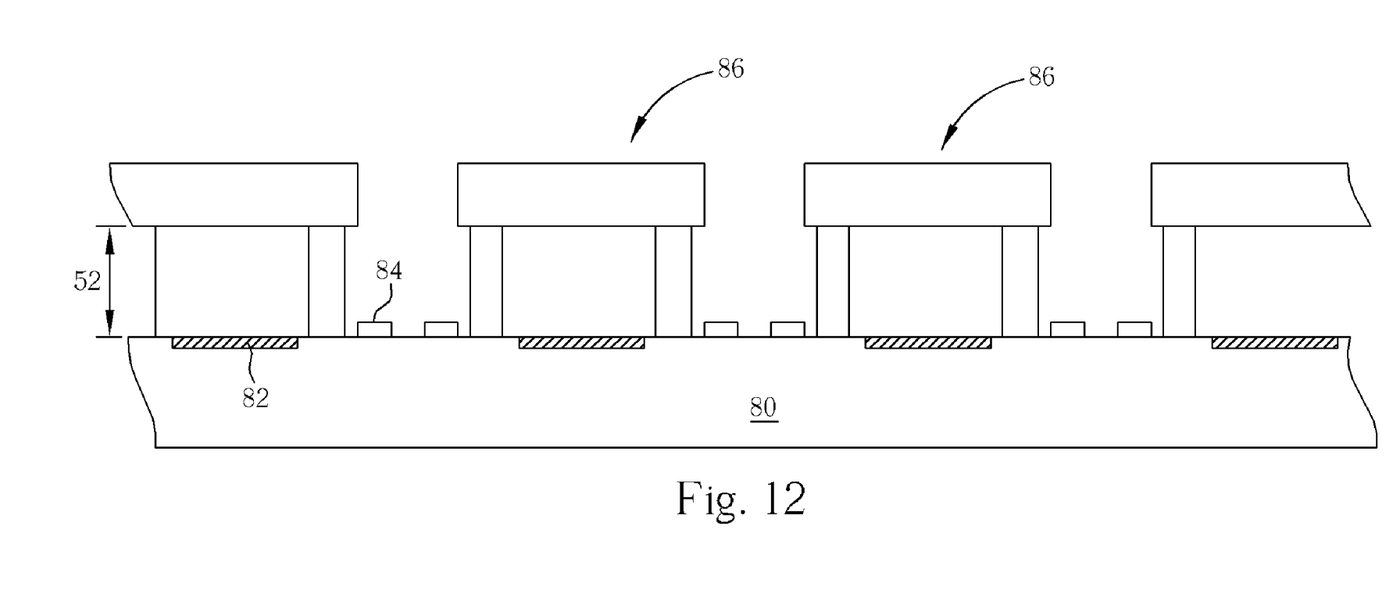
Figure 13:
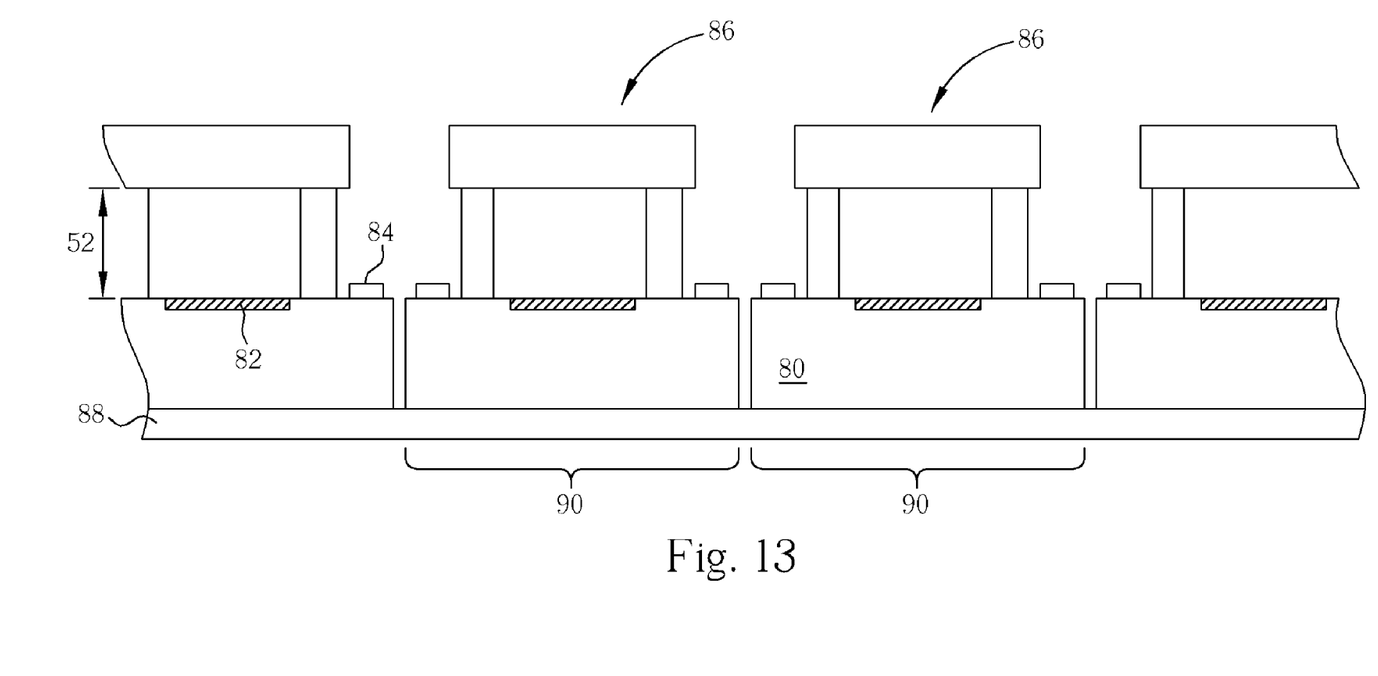

Please refer to FIGS. 12-13. As shown in FIG. 12, a second segmenting process is performed to segment the cap structure 70 at positions corresponding to the contact pads 84. The contact pads 84 are therefore exposed, and a plurality of hermetic windows 86 are formed. In addition, after forming the hermetic windows 86, a test process is performed on the devices 82 and the contact pads 84 on the device wafer 80. As mentioned above, the wafer level package has the advantage of wafer-level testing, which greatly improves an efficiency of the testing process.

As shown in FIG. 13, the device wafer 80 is next attached to a sawing tape 88 and fixed in a frame (not shown). An alignment process and a dicing process are sequentially performed to separate the device wafer 80 along predefined scribe lines into individual dies 90. Then, a wafer sorting process is allowed after the dicing process.

According to the method provided by the present invention, a cap wafer having a hermetic window pattern is bonded to a transparent wafer to form a plurality of cap structures, and then the cap structures are bonded to a device wafer to form a plurality of hermetic windows for protecting devices on the device wafer. Contrasting with the prior art, the present invention introduces batch production to obtain higher yields and reduce cost. Furthermore, because the cap wafer and the transparent wafer are bonded without a sealing medium, the wafer level packages provided by the present invention have a benefit of better air tightness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for wafer level packaging comprising steps of:
   providing a cap wafer;
   forming a patterned film on a surface of the cap wafer and forming a plurality of openings penetrating the cap wafer;
   bonding the cap wafer to a transparent wafer at the surface having the patterned film, wherein the patterned film is not bonded to the transparent wafer;
   segmenting the cap wafer around the patterned film and removing parts of the cap wafer covered by the patterned film to form a plurality of cap structures;
   providing a device wafer with a plurality of devices and a plurality of contact pads electrically connected to the devices; and
   hermetically bonding the cap structures to the device wafer at positions corresponding to the devices to form a plurality of hermetic windows.

2. The method of claim 1, wherein the devices are optical devices, microelectromechanical systems (MEMS), or semiconductor devices.

3. The method of claim 1, further comprising a thinning process applied to the cap wafer before segmenting the cap wafer for adjusting a range between the cap structure and the device wafer.

4. The method of claim 1, wherein the patterned film is used to define shapes and sizes of the hermetic windows.

5. The method of claim 1, wherein the patterned film is a metal film.

6. The method of claim 1, wherein the patterned film is a nonmetal film.

7. The method of claim 1, wherein the step of forming a plurality of openings penetrating the cap wafer further comprises:
   forming a patterned photoresist corresponding to the patterned film on the cap wafer;
   etching the cap wafer where it is not covered by the patterned photoresist; and
   removing the patterned photoresist.

8. The method of claim 7, wherein the patterned film and the patterned photoresist are formed at the same surface of the cap wafer.

9. The method of claim 7, wherein the patterned photoresist is formed at the opposite surface to the patterned film.

10. The method of claim 7, wherein areas covered by the patterned photoresist are larger than areas covered by the patterned film.

11. The method of claim 1, wherein the cap wafer is a semiconductor wafer.

12. The method of claim 1, wherein the transparent wafer is a glass wafer or a quartz wafer.

13. The method of claim 1, wherein the cap wafer and the transparent wafer are bonded by an anodic bonding process or a fusion bonding process.

14. The method of claim 1, wherein the cap structure and the device wafer are bonded by a eutectic bonding process or a glass frit bonding process.

15. The method of claim 1 further comprising steps performed after hermetically bonding the cap structures to the device wafer, the steps comprising:
   segmenting the cap structure at positions corresponding to the contact pads; and
   dicing the device wafer to obtain a plurality of packages.

16. A method for fabricating cap structures comprising steps of:
   providing a cap wafer;
   forming a patterned film on a surface of the cap wafer and forming a plurality of openings penetrating the cap wafer;
   bonding the cap wafer to a transparent wafer at the surface having the patterned film, wherein the patterned film is not bonded to the transparent wafer; and
   segmenting the cap wafer around the patterned film and removing parts of the cap wafer to form a plurality of cap structures.

17. The method of claim 16, wherein the patterned film is a metal film.

18. The method of claim 16, wherein the patterned film is a nonmetal film.

19. The method of claim 16, wherein the step of forming a plurality of openings penetrating the cap wafer comprises:
   forming a patterned photoresist on the cap wafer;
   etching the cap wafer where it is not covered by the patterned photoresist; and
   removing the patterned photoresist.

20. The method of claim 19, wherein the patterned film and the patterned photoresist are formed at the same surface of the cap wafer.

21. The method of claim 19, wherein the patterned photoresist is formed at the opposite surface to the patterned film.

22. The method of claim 19, wherein areas covered by the patterned photoresist are larger than areas covered by the patterned film.

23. The method of claim 16, wherein the cap wafer is a semiconductor wafer.

24. The method of claim 16, wherein the transparent wafer is a glass wafer or a quartz wafer.

25. The method of claim 16, wherein the cap wafer and the transparent wafer are bonded by an anodic bonding process or a fusion bonding process.

* * * * *